United States Patent
Matsuo

(10) Patent No.: US 9,972,338 B2
(45) Date of Patent: May 15, 2018

(54) NOISE SUPPRESSION DEVICE AND NOISE SUPPRESSION METHOD

(71) Applicant: FUJITSU LIMITED, Kawasaki-shi, Kanagawa (JP)

(72) Inventor: Naoshi Matsuo, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days. days.

(21) Appl. No.: 15/603,661

(22) Filed: May 24, 2017

(65) Prior Publication Data
US 2017/0345440 A1 Nov. 30, 2017

(30) Foreign Application Priority Data
May 30, 2016 (JP) .................. 2016-107755

(51) Int. Cl.
| | | |
|---|---|---|
| G10L 21/0264 | (2013.01) | |
| G10L 25/21 | (2013.01) | |
| H04R 3/04 | (2006.01) | |
| G10L 21/0216 | (2013.01) | |
| H04R 3/00 | (2006.01) | |

(52) U.S. Cl.
CPC .......... *G10L 21/0264* (2013.01); *G10L 25/21* (2013.01); *H04R 3/005* (2013.01); *H04R 3/04* (2013.01); *G10L 2021/02165* (2013.01)

(58) Field of Classification Search
CPC ............... G10L 21/0264; G10L 25/21; G10L 2021/02165; H04R 3/005; H04R 3/04
See application file for complete search history.

(56) References Cited

U.S. PATENT DOCUMENTS

| | | | |
|---|---|---|---|
| 5,978,473 A | 11/1999 | Rasmusson | |
| 2002/0181698 A1* | 12/2002 | Takahashi | H04L 12/2854 379/399.01 |
| 2007/0055511 A1 | 3/2007 | Gotanda et al. | |
| 2016/0035366 A1* | 2/2016 | Matsuo | G10L 21/02 381/66 |

FOREIGN PATENT DOCUMENTS

| | | |
|---|---|---|
| EP | 1164712 A1 | 12/2001 |
| EP | 2988301 A2 | 2/2016 |
| EP | 2988301 A3 | 2/2016 |
| JP | 1999-331046 | 11/1999 |
| JP | 2005-084244 | 3/2005 |
| JP | 2008-064892 | 3/2008 |
| JP | 2009-094802 | 4/2009 |

OTHER PUBLICATIONS

Partial European Search Report dated Aug. 8, 2017 for corresponding European Patent Application No. 17173212.6, 12 pages.

* cited by examiner

*Primary Examiner* — Brenda C Bernardi
(74) *Attorney, Agent, or Firm* — Fujitsu Patent Center

(57) ABSTRACT

A noise suppression device includes: an adaptive filter unit that suppresses, using an adaptive filter, a noise component contained in a voice signal generated from a voice captured by a voice input unit to generate a corrected voice signal; a noise generation detection unit that detects timing of generation of the noise component in the voice signal; and a period suppression unit that suppresses the corrected voice signal during a predetermined period of time after the timing of the generation of the noise component.

18 Claims, 10 Drawing Sheets

FIG. 9
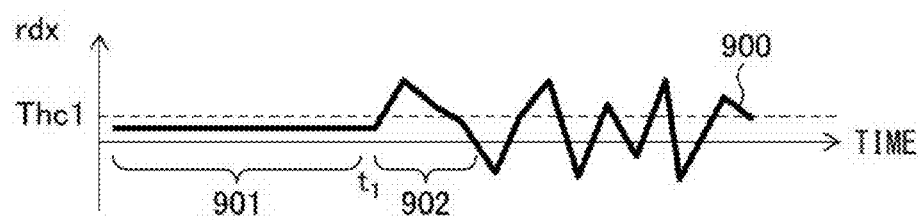
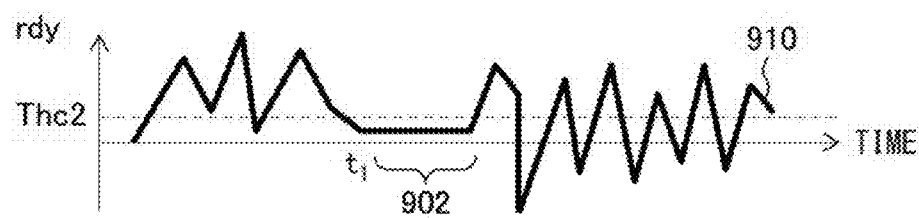
FIG. 10
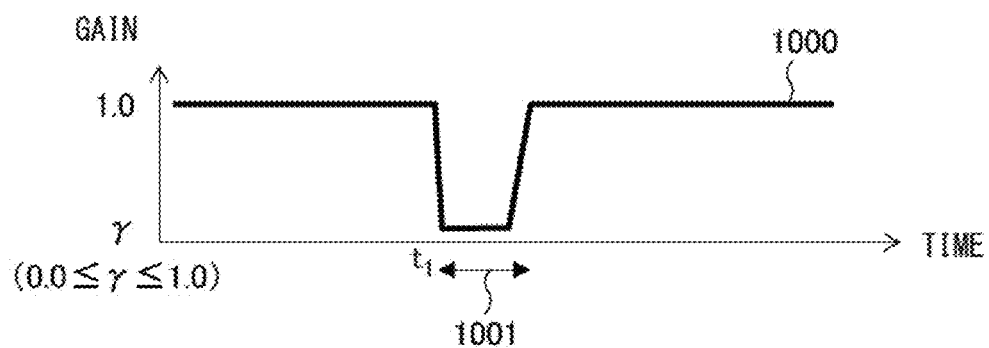

NOISE SUPPRESSION DEVICE AND NOISE SUPPRESSION METHOD

CROSS-REFERENCE TO RELATED APPLICATION

This application is based upon and claims the benefit of priority of the prior Japanese Patent Application No. 2016-107755, filed on May 30, 2016, and the entire contents of which are incorporated herein by reference.

FIELD

The embodiments discussed herein are related to a noise suppression device and a noise suppression method for suppressing a noise component contained in a voice signal.

BACKGROUND

Sound generated from a loudspeaker built into a device capable of inputting and outputting voice may be received as an echo from a microphone built into the device. Voice uttered by a speaker other than a particular speaker may be captured together with voice of the particular speaker by the microphone. Such an echo and other speaker's voice are noise components contained in an input voice signal, which may degrade the quality of the input voice signal and reduce the intelligibility of the voice intended to be captured. In view of this, techniques have been proposed for adaptively suppressing such a noise component (for example, see Japanese Laid-open Patent Publication No. 2009-94802 and Japanese Laid-open Patent Publication No. 2005-84244).

SUMMARY

In the techniques for adaptively suppressing noise, for example, an adaptive filter for suppressing a noise component contained in a voice signal is learned based on a reference signal that is identical to a voice signal output from a loudspeaker, and a voice signal captured by a microphone. In the case when the adaptive filter is used, suppression of the noise component is insufficient until the adaptive filter is optimized to a certain degree.

As disclosed in Japanese Laid-open Patent Publication 2009-94802, a residual echo suppression unit for suppressing a residual echo may be provided separately from the adaptive filter. However, in the case when such a residual echo suppression unit is used, a signal component which has small amplitude and is contained in a voice signal may be suppressed together with a residual echo.

According to one embodiment, a noise suppression device is provided. The noise suppression device includes an adaptive filter unit that suppresses, using an adaptive filter, a noise component contained in a voice signal generated from a voice captured by a voice input unit to generate a corrected voice signal; a noise generation detection unit that detects timing of generation of the noise component in the voice signal; and a period suppression unit that suppresses the corrected voice signal during a predetermined period of time after the timing of generation of the noise component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating one example of the relationship between the time variation in normalized cross-correlation values and the noise generation timing.

FIG. 10 is a diagram illustrating one example of the time variation in the gain used by a period suppression unit.

DESCRIPTION OF EMBODIMENTS

A noise suppression device will be described below with reference to the drawings. The noise suppression device suppresses a noise component contained in a captured voice signal by using an adaptive filter. Further, the noise suppression device detects noise generation timing at which the level of the noise component contained in the captured voice signal is larger than a predetermined threshold value after a period of time during which the level of the noise component is equal to or less than the threshold value. Then, the noise suppression device suppresses the voice signal separately from the adaptive filter for a predetermined period of time after the noise generation timing. Accordingly, the noise suppression device suppresses the noise component contained in the voice signal even before the adaptive filter is optimized, and prevents excessive suppression of the voice signal after optimization of the adaptive filter.

Figure 1:
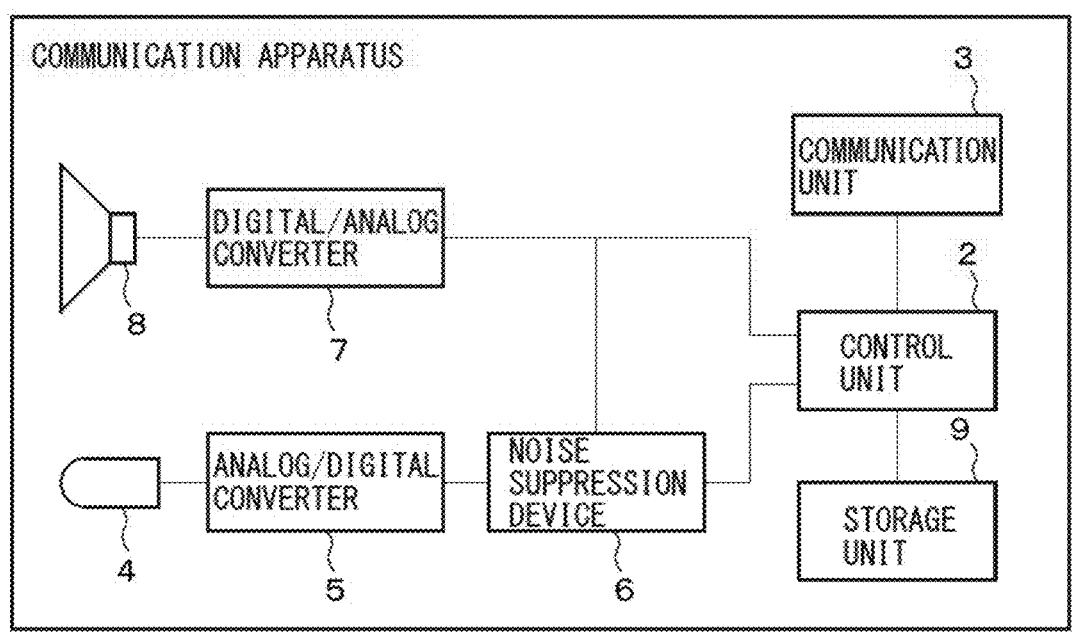
FIG. 1 is a diagram schematically illustrating the configuration of a communication apparatus equipped with a noise suppression device according to a first embodiment.

FIG. 1 is a diagram schematically illustrating the configuration of a communication apparatus equipped with a noise suppression device according to a first embodiment. The communication apparatus 1 is, for example, a vehicle-mounted hands-free phone, or a mobile telephone. As illustrated in FIG. 1, the communication apparatus 1 includes a control unit 2, a communication unit 3, a microphone 4, an analog/digital converter 5, a noise suppression device 6, a digital/analog converter 7, a loudspeaker 8, and a storage unit 9.

Among these units, the control unit 2, the communication unit 3, and the noise suppression device 6 are respectively formed as separate circuits. Alternatively, these units may be equipped on the communication apparatus 1 as one or a plurality of integrated circuits in which the circuits corresponding to these units are integrated. Further, these units may be functional modules implemented by executing a computer program on a processor contained in the communication apparatus 1.

The control unit 2 includes at least one processor, a non-volatile memory and a volatile memory, and peripheral circuits of the processor and the memories. When communication is initiated upon operation by means of an operation unit (not illustrated) such as a keypad, the control unit 2 executes a call control process such as wireless connection or disconnection between the communication apparatus 1 and another communication apparatus (not illustrated) such as a base station, in accordance with a communication standard to which the communication apparatus 1 conforms. Then, in response to a result of the call control process, the control unit 2 instructs the communication unit 3 to initiate or terminate voice communication. Further, the control unit 2 extracts an encoded voice signal or audio signal from a signal received from the other communication apparatus via the communication unit 3, and decodes the voice signal or audio signal. Then, the control unit 2 supplies the decoded voice signal or audio signal as a reproduced voice signal to the noise suppression device 6 and the digital/analog converter 7.

The control unit 2 encodes an input voice signal input through the microphone 4, and generates a transmission signal containing the encoded input voice signal. Then, the control unit 2 passes the transmission signal to the communication unit 3. As an encoding method for the voice signal, for example, an AMR-NB (Adaptive Multi-Rate-Narrow-Band) or the AMR-WB (Adaptive Multi-Rate-WideBand) or the like, which is standardized by the 3GPP (Third Generation Partnership Project), is used.

Alternatively, in response to a user operation by means of the operation unit, the control unit 2 may read out an encoded audio signal stored in the storage unit 9, and may decode the audio signal. Then, the control unit 2 may supply the decoded audio signal as a reproduced voice signal to the noise suppression device 6 and the digital/analog converter 7. In this case, as an encoding method for the audio signal, for example, the MPEG-4 AAC (MPEG-4 Advanced Audio Coding) or the HE-AAC (High-Efficiency AAC), the standards of which are prescribed by the MPEG (Moving Picture Experts Group), are used.

The communication unit 3 wirelessly communicates with another communication apparatus. Then, the communication unit 3 receives a radio signal from the another communication apparatus, and converts the radio signal into a reception signal having a baseband frequency. Then, the communication unit 3 carries out a reception process such as demultiplexing and demodulation on the reception signal, and thereafter, passes the reception signal to the control unit 2. Further, the communication unit 3 carries out a transmission process such as modulation and multiplexing on the transmission signal received from the control unit 2, thereafter superimposes the transmission signal on a carrier having a radio frequency, and then transmits the superimposed transmission signal and the carrier to the another communication apparatus.

The microphone 4 is one example of a voice input unit, which captures sound around the communication apparatus 1 and generates an analog input voice signal proportional to the sound pressure of the sound. The sound captured by the microphone 4 may contain, for example, not only sound reaching the microphone 4 from a sound source such as a user's mouth that is an object from which sound is intended to be captured, but also a reproduced sound output from the loudspeaker 8 as being an echo. The microphone 4 supplies the analog input voice signal to the analog/digital converter 5.

The analog/digital converter 5 generates a digitized input voice signal by sampling the analog input voice signal received from the microphone 4 at a predetermined sampling pitch. Further, the analog/digital converter 5 may include an amplifier, and may amplify the analog input voice signal and thereafter digitize the analog input voice signal.

The analog/digital converter 5 supplies the digitized input voice signal to the noise suppression device 6. Hereinafter, the digitized input voice signal will be referred to simply as the input voice signal.

The noise suppression device 6 generates a corrected voice signal by suppressing the noise component contained in the input voice signal. In the present embodiment, the noise suppression device 6 suppresses, as the noise component, an echo due to a reproduced voice signal which is reproduced from the loudspeaker 8 and is captured by the microphone 4. Then, the noise suppression device 6 supplies the corrected voice signal to the control unit 2. The noise suppression device 6 will be described later in detail.

The digital/analog converter 7 analogizes the reproduced voice signal received from the control unit 2 by performing digital-to-analog conversion. The digital/analog converter 7 may include an amplifier, and may amplify the analogized reproduced voice signal by using the amplifier. Then, the digital/analog converter 7 supplies the analogized reproduced voice signal to the loudspeaker 8.

The loudspeaker 8 is one example of a voice output unit, which reproduces the analogized reproduced voice signal received from the digital/analog converter 7.

The storage unit 9 includes, for example, a non-volatile semiconductor memory, which stores various pieces of data used in the communication apparatus 1 such as user's personal information, mail history information, telephone number, or an audio signal or video signal.

Figure 2:
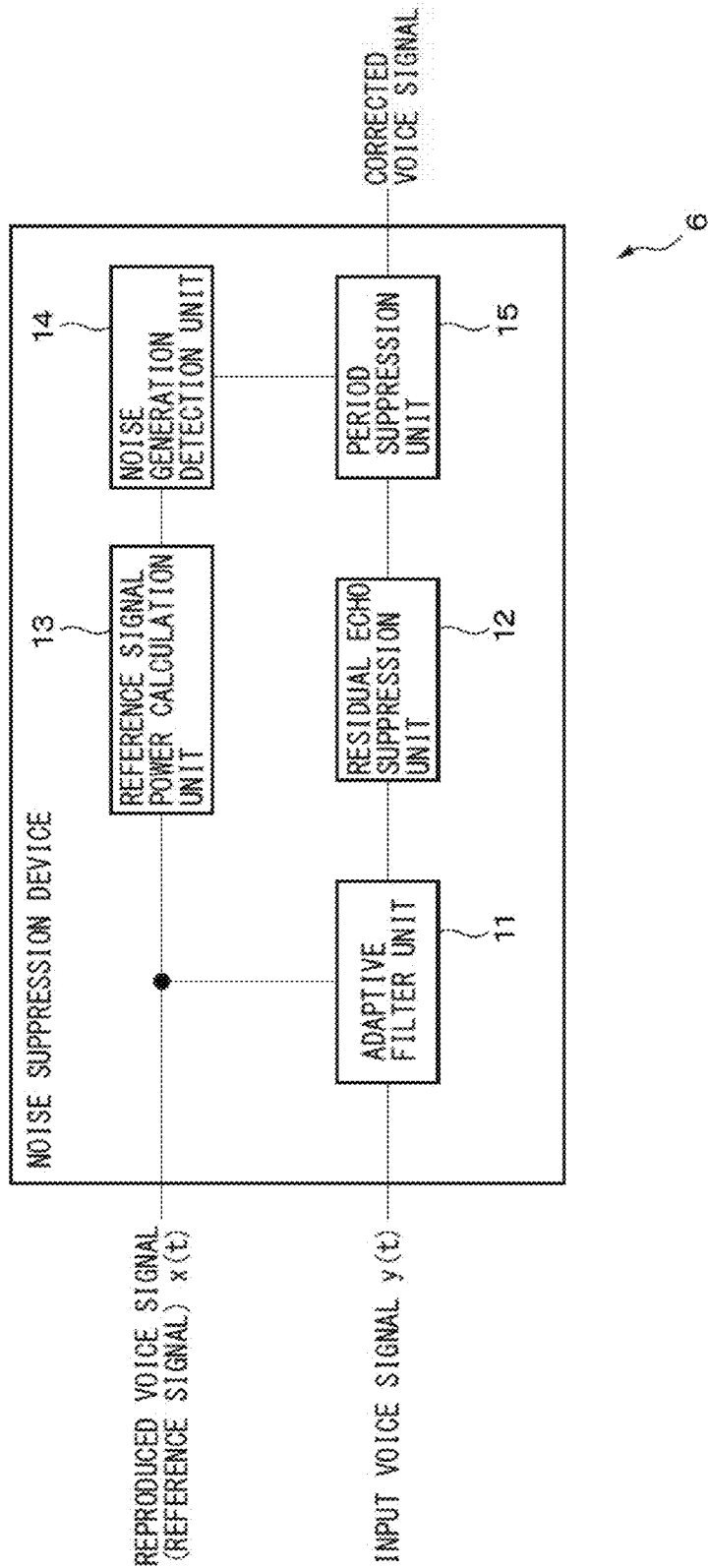
FIG. 2 is a diagram schematically illustrating the configuration of the noise suppression device according to the first embodiment.

The noise suppression device 6 will be described below in detail. FIG. 2 is a diagram schematically illustrating the configuration of the noise suppression device 6 according to the first embodiment. The noise suppression device 6 includes an adaptive filter unit 11, a residual echo suppression unit 12, a reference signal power calculation unit 13, a noise generation detection unit 14, and a period suppression unit 15. These units of the noise suppression device 6 may be respectively equipped as separate circuits on the noise suppression device 6, or alternatively, may be one or a plurality of integrated circuits for implementing the functions of the respective units.

For the purpose of convenience, a reproduced voice signal supplied to the noise suppression device 6 from the control unit 2 will be hereinafter referred to as a reference signal that is distinguished from a reproduced voice signal supplied to the loudspeaker 8 from the control unit 2 via the digital/analog converter 7. In other words, a reproduced voice signal and a reference signal are voice signals having an identical waveform. Further, an echo component contained in an input voice signal obtained by capturing, by using the microphone 4, the voice of the reproduced voice signal reproduced by the loudspeaker 8 is one example of the noise component.

The adaptive filter unit 11 suppresses the echo component contained in the input voice signal by using an adaptive filter. In the present embodiment, the adaptive filter unit 11 uses an Nth-order (N is an integer equal to or more than 1, and is set to, for example, 16 to 128) finite impulse response (FIR) adaptive filter as the adaptive filter. In this case, a filter process by use of the adaptive filter is represented by the following equation:

$$e(t) = y(t) - \sum_{i=0}^{N-1} a_i x(t-i) \quad (1)$$

where x(t) is a reference signal at time t, y(t) is an input voice signal at time t, and $a_i$ (i=0, 1, ..., and N−1) is a filter coefficient of the adaptive filter. In addition, e(t) is a corrected voice signal at time t, which is to be output from the adaptive filter unit 11. The corrected voice signal e(t) may contain a residual component of an echo (hereinafter referred to as a residual echo component).

Further, the adaptive filter unit 11 learns the adaptive filter based on the reference signal and the input voice signal by updating the filter coefficient by using, for example, the learning identification method. The coefficient of the adaptive filter is updated in accordance with, for example, the following equation:

$$a_i' = a_i + \alpha \cdot e(t) \frac{x(t-i)}{\sum_{j=0}^{N-1} x^2(t-j)} \quad (2)$$

where $a_i'$ (i=0, 1, ..., and N−1) is an updated filter coefficient. In addition, α is a convergence coefficient for determining the update speed for the adaptive filter, and is set to, for example, a value more than 0.0 and less than 1.

The adaptive filter unit 11 supplies the corrected voice signal to the residual echo suppression unit 12.

The residual echo suppression unit 12 suppresses the residual echo component contained in the corrected voice signal by performing a non-linear filtering process. In the present embodiment, the residual echo suppression unit 12 calculates a power of the corrected voice signal and determines, based on the power, a gain to be multiplied by the corrected voice signal.

The residual echo suppression unit 12 calculates, for example, an average value of the power of the corrected voice signal at each of times included in a frame terminating at a current time t, as a power Pe(t) of the corrected voice signal at the current time t, in accordance with the following equation:

$$Pe(t) = 10\log_{10}\left(\sum_{j=0}^{N-1} e(t-j)^2 / N\right) \quad (3)$$

where N is an integer equal to or more than 1, and represents a frame length. N is set to, for example, 16 to 1024.

Figure 3:
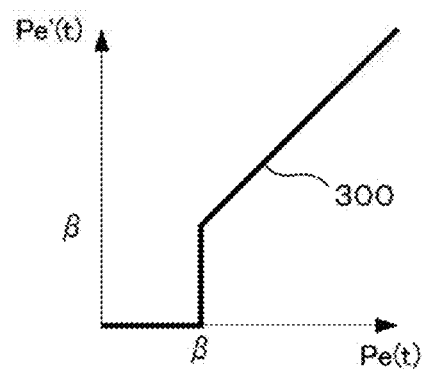
FIG. 3 is a diagram illustrating one example of the relationship between the power of a corrected voice signal and the gain used by a residual echo suppression unit.

FIG. 3 is a diagram illustrating one example of the relationship between the power Pe(t) of the corrected voice signal and the gain used by the residual echo suppression unit 12. In FIG. 3, the abscissa represents the power Pe(t) of the corrected voice signal input to the residual echo suppression unit 12, and the ordinate represents a power Pe'(t) of the corrected voice signal output from the residual echo suppression unit 12. A graph 300 represents the relationship between the power Pe(t) of the corrected voice signal input to the residual echo suppression unit 12 and the power Pe'(t) of the corrected voice signal output from the residual echo suppression unit 12.

When the power Pe(t) is equal to or greater than a power threshold value β, it is estimated that the corrected voice signal e(t) contains a component of sound other than the residual echo component or a component of sound around the microphone. In this case, the residual echo suppression unit 12 does not suppress the corrected voice signal e(t). In other words, the residual echo suppression unit 12 sets the gain to be multiplied by the corrected voice signal e(t) to 1.0. The power threshold value β is set to, for example, a value 50 dB less than the maximum value that the power Pe(t) can take (hereinafter, referred to as full scale).

On the other hand, when the power Pe(t) is less than the power threshold value β, it is estimated that the corrected voice signal e(t) contains only the residual echo component. In this case, the residual echo suppression unit 12 sets the gain to 0. Alternatively, in order that the corrected voice signal e(t) takes a value 60 dB less than the full scale of Pe(t), the residual echo suppression unit 12 may calculate the gain g(t) in accordance with the following equation: herein, the amplitude of the full scale is defined as 1.0.

$$g(t) = \frac{0.001}{\sqrt{\sum_{j=0}^{N-1} e(t-j)^2 / N}} \quad (4)$$

The residual echo suppression unit 12 suppresses the residual echo component contained in the corrected voice signal by multiplying the corrected voice signal e(t) by the gain g(t). Then, the residual echo suppression unit 12 supplies the corrected voice signal in which the residual echo component is suppressed to the period suppression unit 15.

The reference signal power calculation unit 13 calculates a power of the reference signal at each time. For example, the reference signal power calculation unit 13 calculates a power Px(t) of the reference signal at time t in accordance with the following equation:

$$Px(t) = 10\log_{10}\left(\sum_{j=0}^{M-1} x(t-j)^2 / M\right) \quad (5)$$

where M is an integer equal to or more than 1, and represents the number of sampling points used for calculating the power Px(t) of the reference signal. For the sake of earlier detection of noise generation timing, M is preferably smaller than N.

The reference signal power calculation unit 13 notifies, every time the power of the reference signal is calculated, the noise generation detection unit 14 and the period suppression unit 15 of the power.

The noise generation detection unit 14 detects noise generation timing based on the power of the reference signal at each time.

Figure 4:
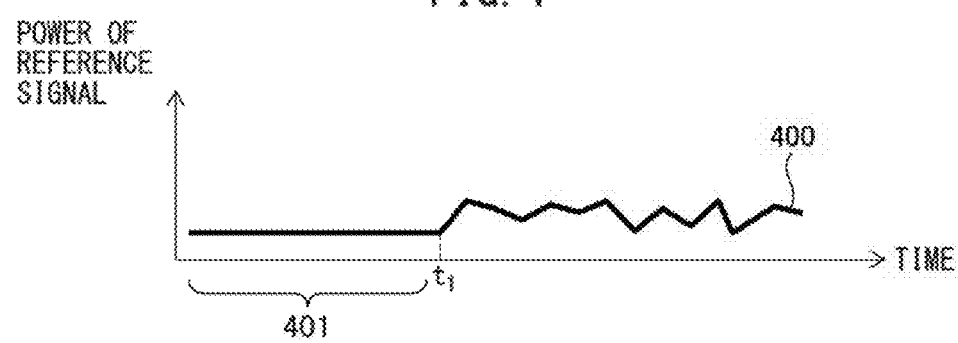
FIG. 4 is a diagram illustrating one example of the relationship between the time variation in the power of a reference signal and the noise generation timing.

FIG. 4 is a diagram illustrating one example of the relationship between the time variation in the power of the reference signal and the noise generation timing. In FIG. 4, the abscissa represents a lapse time, and the ordinate represents the power. A graph 400 represents the time variation in the power Px(t) of the reference signal. In this example, time $t_1$ is defined as the noise generation timing.

During a period 401 before time $t_1$ at which no echo due to the reproduced voice signal output from the loudspeaker 8 is generated, the power Px(t) of the reference signal continuously is equal to or less than a threshold value ThP. On the other hand, at or after time $t_1$, the reproduced voice signal is output from the loudspeaker 8. Thus, at or after time $t_1$, the power Px(t) of the reference signal may exceed the threshold value ThP.

Therefore, the noise generation detection unit 14 determines, as the noise generation timing, for example, a first time at which the power Px(t) of the reference signal exceeds the threshold value ThP after a period of time during which the power Px(t) of the reference signal continuously is equal to or less than the threshold value ThP reaches a predetermined time length. The predetermined time length is set to, for example, about several seconds. Accordingly, the noise generation detection unit 14 is able to prevent erroneously detecting, as the noise generation timing, a time at which the power of the reproduced voice signal output from the loudspeaker 8 exceeds the threshold value ThP again after the power momentarily is equal to or less than the threshold value ThP.

The noise generation detection unit 14 may determine, as the noise generation timing, a first time at which an absolute value of the amplitude of the reference signal exceeds a predetermined threshold value after a period of time during which the absolute value of the amplitude of the reference signal is equal to or less than the predetermined threshold value reaches a predetermined time length.

The noise generation detection unit 14 notifies, upon detecting the noise generation timing, the period suppression unit 15 of the generation timing.

The period suppression unit 15 suppresses, upon being notified of the noise generation timing, the corrected voice signal supplied from the residual echo suppression unit 12 for a predetermined period of time after the noise generation timing.

Figure 5:
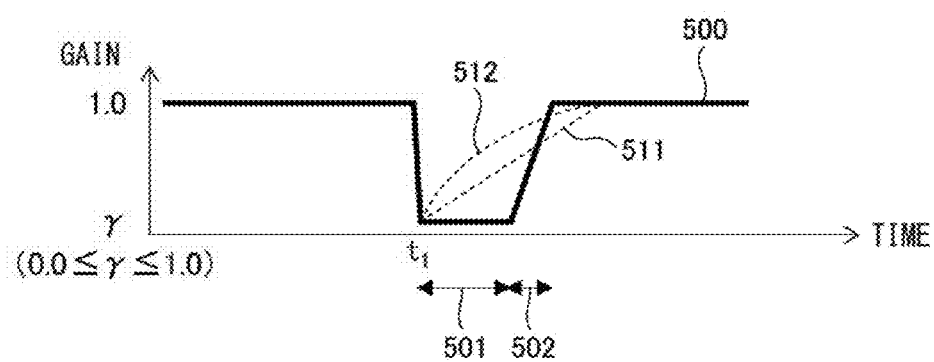
FIG. 5 is a diagram illustrating one example of the time variation in the gain used by a period suppression unit.

FIG. 5 is a diagram illustrating one example of the time variation in the gain used by the period suppression unit 15. In FIG. 5, the abscissa represents a lapse time, and the ordinate represents the gain. A graph 500 represents the time variation in the gain. In this example, it is assumed that time $t_1$ is the noise generation timing. As illustrated in the graph 500, the gain is set to a value γ in a range between 0 and 1 for a first period 501 starting from the noise generation timing $t_1$. The gain then monotonously increases during a second period 502 after a lapse of the first period 501, and the gain reaches 1 at a point of time when the second period 502 is elapsed. In other words, the corrected voice signal is suppressed for the first period 501 and the second period 502 starting from the noise generation timing $t_1$. The first period 501 is set to, for example, a time length equivalent to a period of time taken in optimization of the adaptive filter used in the adaptive filter unit 11 added with offset, for example, a time length of about 500 msec. The second period 502 is set to about a fraction to one-tenth of the first period. Further, γ is set in advance in accordance with the quality needed for the corrected voice signal. For example, γ is set to about 0.1 to 0.2.

According to a modified example, the value γ of the gain in the first period may be set dynamically based on the power of the corrected voice signal. For example, the larger the power of the corrected voice signal at or after the noise generation timing is, the smaller the period suppression unit 15 may set the value γ of the gain, i.e., the larger the period suppression unit 15 may set the amount of suppression of the corrected voice signal.

According to another modified example, the length of the first period may be adjusted in accordance with a degree of progress in learning of the adaptive filter used in the adaptive filter unit 11. For example, the period suppression unit 15 may terminate the first period at a point of time when learning of the adaptive filter is converged. In this case, the period suppression unit 15 may determine that learning of the adaptive filter is converged at a point of time when, for example, the sum of absolute values of the difference between the latest value of each of coefficients of the adaptive filter ($a'_i$ in equation (2)) and the immediately previous value of the corresponding coefficient ($a_i$ in equation (2)) is equal to or less than a convergence determination threshold value.

According to still another modified example, the period suppression unit 15 may decrease the value of the gain to γ at the noise generation timing and thereafter monotonously increase the gain in a linear shape with a lapse of time, as illustrated by a dotted-line graph 511 in FIG. 5. Alternatively, the period suppression unit 15 may decrease the value of the gain to γ at the noise generation timing and thereafter monotonously increase the gain with a lapse of time in accordance with an upward-convex non-linear function, as illustrated by a dotted-line graph 512 in FIG. 5.

The period suppression unit 15 suppresses the corrected voice signal for a predetermined period of time after the noise generation timing by multiplying the corrected voice signal by the thus-determined gain. Accordingly, the period suppression unit 15 is able to suppress the noise component contained in the input voice signal during the time before the adaptive filter is optimized.

In addition, the period suppression unit 15 does not suppress the corrected voice signal after a predetermined period of time elapsed from the noise generation timing. This prevents excessive suppression of the corrected voice signal during the lapse of the period of time. As a result, for example, when the input voice signal contains a voice uttered by a speaker, consonants and the like contained in the sound are prevented from being unable to be heard.

Figure 6:
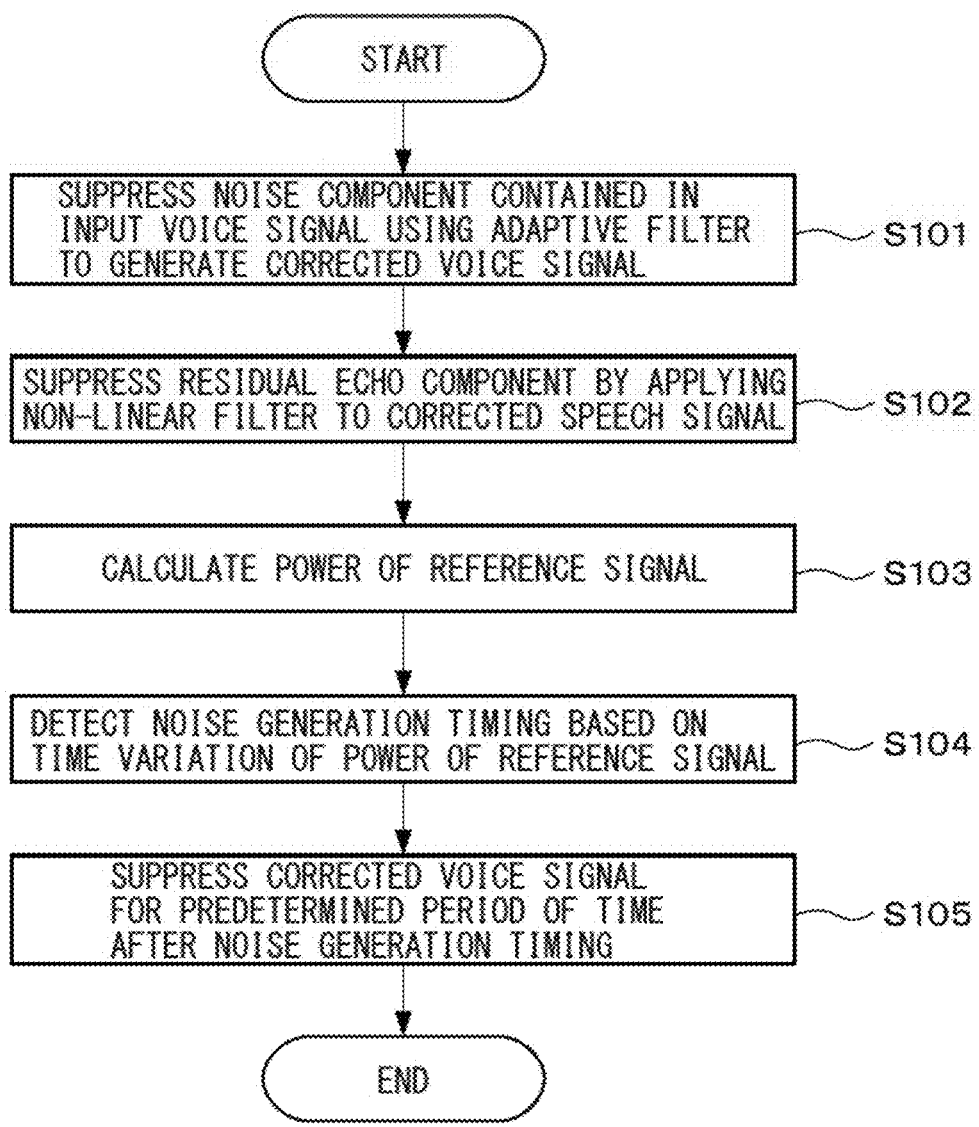
FIG. 6 is an operation flowchart illustrating a noise suppression process.

FIG. 6 is an operation flowchart illustrating a noise suppression process executed by the noise suppression device 6. The adaptive filter unit 11 suppresses a noise component contained in an input voice signal by using an adaptive filter, and generates a corrected voice signal (Step S101). The residual echo suppression unit 12 applies a non-linear filter to the corrected voice signal and suppresses a residual echo component (Step S102).

The reference signal power calculation unit 13 calculates a power of a reference signal (Step S103). Then, the noise generation detection unit 14 detects noise generation timing based on the time variation in the power of the reference signal (Step S104).

The period suppression unit 15 suppresses the corrected voice signal for a predetermined period of time after the noise generation timing (Step S105). The period suppression unit 15 then outputs the suppressed corrected voice signal. The processing of Steps S101 and S102 and the processing of Steps S103 and S104 may be parallelly carried out.

As has been described above, the noise suppression device detects the noise generation timing based on the time variation in the power of the reference signal, and suppresses the voice signal separately from the adaptive filter for a predetermined period of time after the noise generation timing. Accordingly, the noise suppression device is able to suppress noise during a period of time before the adaptive filter is optimized, and is able to prevent excessive suppression of the voice signal after optimization of the adaptive filter.

According to a modified example, the corrected voice signal output from the adaptive filter unit 11 may be input to the period suppression unit 15, and the corrected voice signal output from the period suppression unit 15 may be input to the residual echo suppression unit 12. According to another modified example, when the corrected voice signal output from the adaptive filter unit 11 contains a sufficiently small residual echo component, such as when the number of taps of the adaptive filter can be set to be long enough, the residual echo suppression unit 12 may be omitted.

Next, a noise suppression device according to a second embodiment will be described. The noise suppression device according to the second embodiment suppresses noise contained in a voice signal and originating from a voice source other than a voice source of interest by using microphones arranged at mutually different locations.

Figure 7:
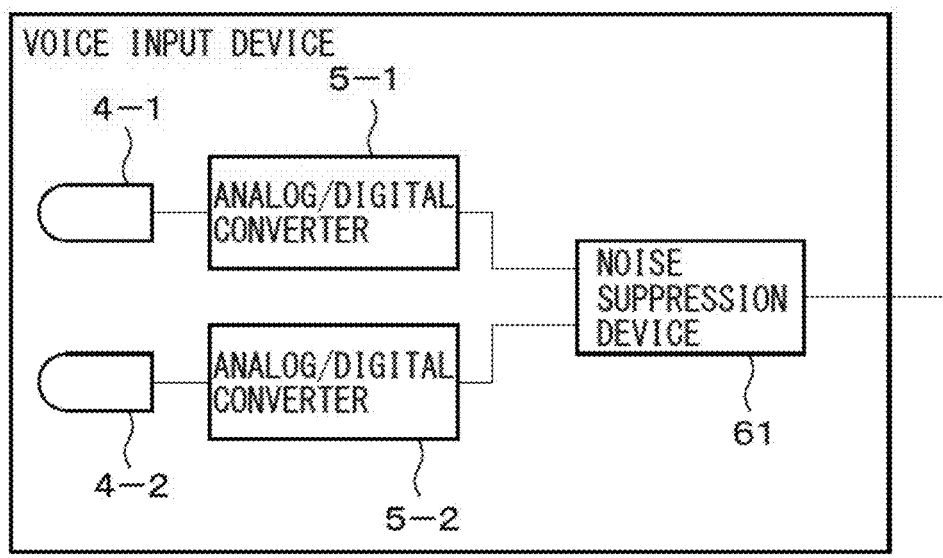
FIG. 7 is a diagram schematically illustrating the configuration of a voice input device equipped with a noise suppression device according to a second embodiment.

FIG. 7 is a diagram schematically illustrating the configuration of a voice input device equipped with the noise suppression device according to the second embodiment. The voice input device 21 includes two microphones 4-1 and 4-2, two analog/digital converters 5-1 and 5-2, and the noise suppression device 61. The voice input device 21 is mounted on, for example, a vehicle (not illustrated), captures voice uttered by a driver, and supplies the voice to a navigation system (not illustrated), a hands-free phone (not illustrated), or the like.

The microphones 4-1 and 4-2 are one example of a voice input unit, which microphones are arranged at mutually different locations. For example, the microphone 4-1 is disposed in the vicinity of a driver as a voice source of interest, for example, an instrument panel or near a vehicle interior ceiling on the driver's side. On the other hand, the microphone 4-2 is disposed in the vicinity of a passenger in a passenger seat (hereinafter, simply referred to as a passenger) as a noise generation source (hereinafter, simply referred to as a noise source), for example, near a vehicle interior ceiling on the passenger's side. An analog input voice signal generated from ambient sound captured by the microphone 4-1 is input to the analog/digital converter 5-1. Similarly, an analog input voice signal generated from ambient sound captured by the microphone 4-2 is input to the analog/digital converter 5-2.

The analog/digital converter 5-1 generates a digitized input voice signal by sampling the analog input voice signal received from the microphone 4-1 at a predetermined sampling pitch. Similarly, the analog/digital converter 5-2 generates a digitized input voice signal by sampling the analog input voice signal received from the microphone 4-2 at a predetermined sampling pitch.

Hereinafter, for the purpose of convenience, an input voice signal generated from sound captured by the microphone 4-1 and digitized by the analog/digital converter 5-1 is referred to as a first input voice signal. In addition, an input voice signal generated from sound captured by the microphone 4-2 and digitized by the analog/digital converter 5-2 is referred to as a second input voice signal.

The analog/digital converter 5-1 supplies the first input voice signal to the noise suppression device 61. Similarly, the analog/digital converter 5-2 supplies the second input voice signal to the noise suppression device 61.

Figure 8:
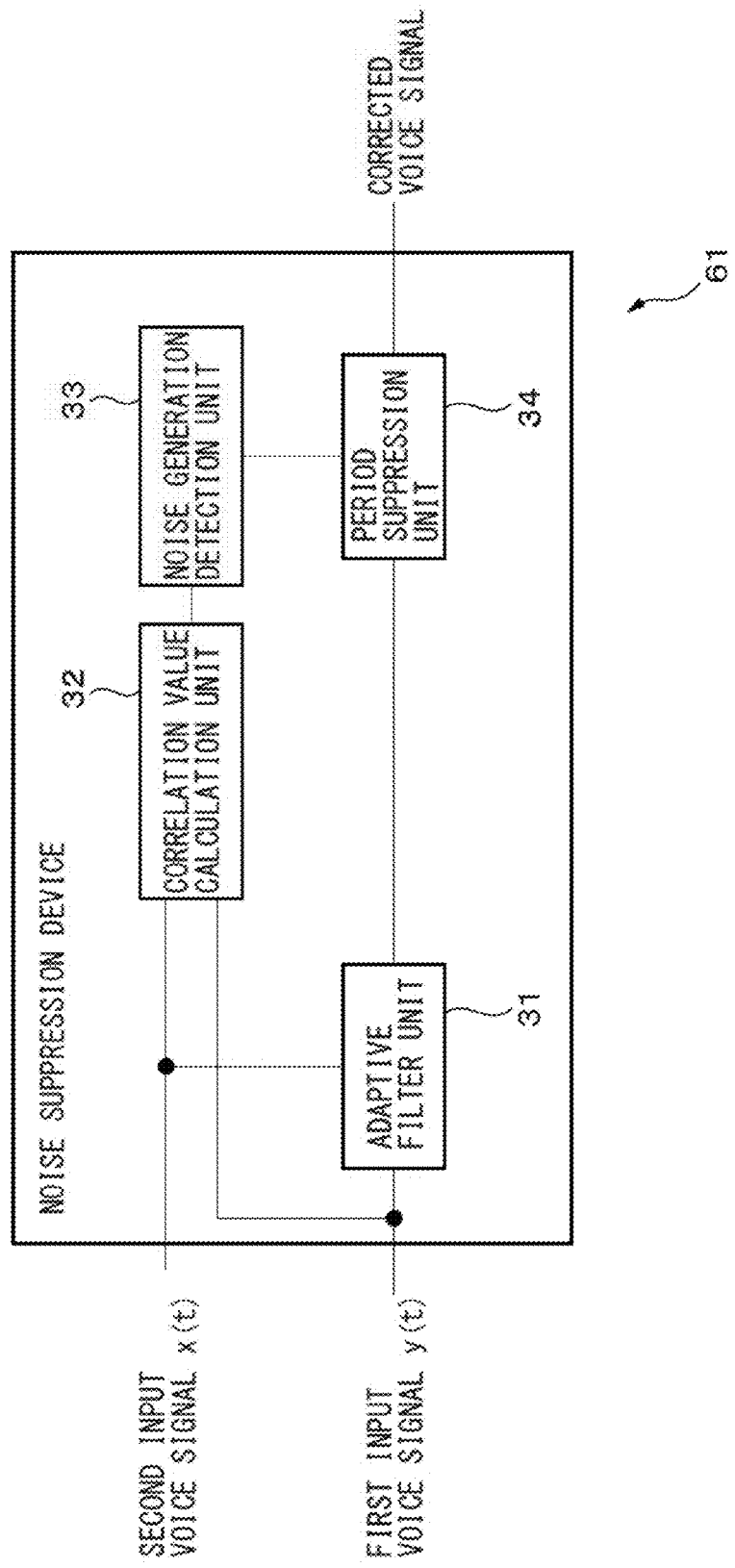
FIG. 8 is a diagram schematically illustrating the configuration of the noise suppression device according to the second embodiment.

FIG. 8 is a diagram schematically illustrating the configuration of the noise suppression device 61 according to the second embodiment. The noise suppression device 61 includes an adaptive filter unit 31, a correlation value calculation unit 32, a noise generation detection unit 33, and a period suppression unit 34. These units of the noise suppression device 61 may be respectively equipped as separate circuits to the noise suppression device 61, or alternatively, may be one or a plurality of integrated circuits for implementing the functions of these units.

The adaptive filter unit 31 suppresses, by using an adaptive filter, the voice uttered by the passenger as one example of a noise component contained in the first input voice signal. For this purpose, the adaptive filter unit 31 may execute, for example, the FIR filtering process represented by equation (1) where the first input voice signal at time t is denoted by $y(t)$ and the second input voice signal at time t is denoted by the reference signal $x(t)$. Thus, the adaptive filter unit 31 outputs a corrected voice signal $e(t)$ in which the voice uttered by the passenger is suppressed. Before optimization of the adaptive filter, the corrected voice signal $e(t)$ contains a residual noise component that is an unremoved part of the component corresponding to the voice uttered by the passenger.

Further, the adaptive filter unit 31 may learn the adaptive filter by, for example, updating the filter coefficient in accordance with equation (2).

The corrected voice signal $e(t)$ output from the adaptive filter unit 31 is input to the period suppression unit 34.

The correlation value calculation unit 32 calculates, for each time, a cross-correlation value between the first input voice signal and the second input voice signal, the cross-correlation value representing the certainty of the voice from the voice source of interest, and a cross-correlation value between the first input voice signal and the second input voice signal, the cross-correlation value representing the certainty of the voice from the noise source.

In the present embodiment, the distance from the driver as the voice source of interest to each of the microphones, and the distance from the passenger as the noise source to each of the microphones are assumed in advance. In addition, the distance from the driver to the microphone 4-2 is longer than the distance from the driver to the microphone 4-1. Thus, when the driver utters voice, a driver's voice contained in the second input voice signal is delayed relative to a driver's voice contained in the first input voice signal by a length of time corresponding to the difference in the distances. Conversely, the distance from the passenger to the microphone 4-2 is shorter than the distance from the passenger to the microphone 4-1. Thus, when the passenger utters voice, a passenger's voice contained in the first input voice signal is delayed relative to a passenger's voice contained in the second input voice signal by a length of time corresponding to the difference in the distances.

Therefore, the correlation value calculation unit 32 calculates a normalized cross-correlation value $rdy$ between the second input voice signal and the first input voice signal in accordance with a length of time $dy$ corresponding to the difference between the distance from the driver to the microphone 4-1 and the distance from the driver to the microphone 4-2, in accordance with the following equation:

$$rdy = \frac{\sum_{j=0}^{N-1} x(t-j)y(t-j-dy)}{\sqrt{\sum_{j=0}^{N-1} x(t-j)^2 \sum_{j=0}^{N-1} y(t-j-dy)^2}} \quad (6)$$

The normalized cross-correlation value rdy represents the certainty of being the voice uttered by the driver, i.e., the certainty of being the voice originating from the voice source of interest. The larger the normalized cross-correlation value rdy is, the higher the certainty of being the voice originating from the voice source of interest is.

Similarly, the correlation value calculation unit 32 calculates a normalized cross-correlation value rdx between the first input voice signal and the second input voice signal in accordance with a length of time dx corresponding to the difference between the distance from the passenger to the microphone 4-1 and the distance from the passenger to the microphone 4-2, in accordance with the following equation:

$$rdx = \frac{\sum_{j=0}^{N-1} x(t-j-dx)y(t-j)}{\sqrt{\sum_{j=0}^{N-1} x(t-j-dx)^2 \sum_{j=0}^{N-1} y(t-j)^2}} \quad (7)$$

The normalized cross-correlation value rdx represents the certainty of being the voice uttered by the passenger, i.e., the certainty of being the voice originating from the noise source. The larger the normalized cross-correlation value rdx is, the higher the certainty of being the voice originating from the noise source is.

The correlation value calculation unit 32 supplies, every time the normalized cross-correlation values rdx and rdy are calculated, the normalized cross-correlation values rdx and rdy to the noise generation detection unit 33.

The noise generation detection unit 33 detects, based on the time variation in the normalized cross-correlation values rdx and rdy, noise generation timing, i.e., timing at which the passenger utters voice in the present embodiment.

FIG. 9 is a diagram illustrating one example of the relationship between the time variation in the normalized cross-correlation values rdx and rdy and the noise generation timing. In FIG. 9, the abscissa represents a lapse time, and the ordinate represents the normalized cross-correlation value. A graph 900 represents the time variation in the normalized cross-correlation value rdx. In addition, a graph 910 represents the time variation in the normalized cross-correlation value rdy. In this example, it is assumed that the passenger does not utter voice during a period 901 before time $t_1$, and that the passenger utters voice while the driver stops uttering voice during a period 902 at or after time $t_1$.

Since the passenger does not utter voice during the period 901, the normalized cross-correlation value rdx representing the certainty of being the voice uttered by the passenger continuously is equal to or less than a threshold value ThC1. On the other hand, since the passenger utters voice while the driver stops uttering voice during the period 902 at or after time $t_1$, the normalized cross-correlation value rdx exceeds the threshold value ThC1 while the normalized cross-correlation value rdy representing the certainty of being the voice uttered by the driver is equal to or less than the threshold value ThC2.

Therefore, the noise generation detection unit 33 determines, as the noise generation timing, a first time at which the normalized cross-correlation value rdx exceeds the threshold value ThC1 and the normalized cross-correlation value rdy is equal to or less than the threshold value ThC2 after a period of time during which the normalized cross-correlation value rdx continuously is equal to or less than the threshold value ThC1 reaches a predetermined time length. The predetermined time length is set to, for example, about several seconds. In addition, the threshold values ThC1 and ThC2 are set to, for example, 0.4.

The first time at which the normalized cross-correlation value rdx exceeds the threshold value ThC1 after a period of time during which the normalized cross-correlation value rdx continuously is equal to or less than the threshold value ThC1 reaches a predetermined time length may be different from the first time at which the normalized cross-correlation value rdy is equal to or less than the threshold value ThC2. In the present embodiment, since the reduction in the intelligibility of the driver's voice contained in the corrected voice signal is not preferable, then the corrected voice signal should not be suppressed when the driver speaks. On the other hand, when the normalized cross-correlation value rdx is equal to or less than the threshold value ThC1, the noise itself to be suppressed is small, and hence there is no need to further suppress the corrected voice signal. Therefore, by setting a condition for detecting the noise generation timing as described above, the noise suppression device 61 is able to suppress the passenger's voice while preventing the reduction in the intelligibility of the driver's voice.

According to a modified example, the noise generation detection unit 33 may detect the noise generation timing without using the normalized cross-correlation value rdy. For example, the noise generation detection unit 33 may determine, as the noise generation timing, a first time at which the normalized cross-correlation value rdx exceeds the threshold value ThC1 after a period of time during which the normalized cross-correlation value rdx continuously is equal to or less than the threshold value ThC1 reaches a predetermined time length. In this case, the correlation value calculation unit 32 may not calculate the normalized cross-correlation value rdy. This reduces the amount of operation needed for detecting the noise generation timing.

The noise generation detection unit 33 notifies, upon detecting the noise generation timing, the period suppression unit 34 of the generation timing.

The period suppression unit 34 suppresses, upon being notified of the noise generation timing, the corrected voice signal supplied from the adaptive filter unit 31 for a predetermined period of time after the noise generation timing.

FIG. 10 is a diagram illustrating one example of the time variation in the gain used by period suppression unit 34. In FIG. 10, the abscissa represents a lapse time, and the ordinate represents the gain. A graph 1000 represents the time variation in the gain. In this example, it is assumed that time $t_1$ is the noise generation timing. As illustrated by the graph 1000, the gains set to a value γ in a range between 0 and 1 for a suppression period 1001 starting from the noise generation timing $t_1$. The gain before the suppression period 1001 and after lapse of the suppression period 1001 is 1. In other words, the corrected voice signal is kept suppressed for the suppression period 1001 starting from the noise generation timing $t_1$. The suppression period 1001 is set to, for example, a time length equivalent to a period of time taken in optimization of the adaptive filter used in the adaptive filter unit 31 added with offset, for example, a time length of about 700 to 800 msec. Further, γ is set in advance in accordance with the quality needed for the corrected voice signal. For example, γ is set to about 0.1 to 0.2.

According to a modified example, the length of the suppression period may be dynamically adjusted. For example, the period suppression unit 34 may terminate the suppression period when the normalized cross-correlation value rdy representing the certainty of being the voice uttered by the driver exceeds the threshold value ThC2. Alternatively, the period suppression unit 34 may terminate the suppression period at timing when the time elapsed from the noise generation timing reaches a length of the suppression period set in advance or at timing when the normalized cross-correlation value rdy exceeds the threshold value ThC2, whichever comes first. Alternatively, similarly to the first embodiment, the length of the suppression period may be set dynamically in accordance with a degree of progress in learning of the adaptive filter used in the adaptive filter unit 31. For example, the period suppression unit 34 may terminate the suppression period at a point of time when learning of the adaptive filter is converged. The period suppression unit 34 may determine that learning of the adaptive filter is converged at a point of time when the sum of absolute values of the difference between the latest value of each of coefficients of the adaptive filter ($a'_i$ in equation (2)) and the immediate previous value of the corresponding coefficient ($a_i$ in equation (2)) is equal to or less than a convergence determination threshold value.

According to another modified example, similarly to the first embodiment, the period suppression unit 34 may decrease the value of the gain to γ at the noise generation timing and thereafter monotonously increase the gain with a lapse of time. Alternatively, the larger the normalized cross-correlation value rdx at or after the noise generation timing is, the smaller the period suppression unit 15 may set the value γ of the gain, i.e., the larger the period suppression unit 15 may set the amount of suppression of the corrected voice signal.

According to still another modified example, the period suppression unit 34 may determine, as the suppression period, a period of time during which the residual noise level exceeds a predetermined threshold value at or after the noise generation timing. In other words, it is estimated that, during a period of time when the normalized cross-correlation value rdx exceeds the threshold value ThC1 and the normalized cross-correlation value rdy is equal to or less than the threshold value ThC2 at or after the noise generation timing, only the passenger utters voice. Therefore, the period suppression unit 34 may calculate the power of the corrected voice signal e(t) in this period of time as the residual noise level.

The period suppression unit 34 suppresses the corrected voice signal e(t) for a predetermined period of time after the noise generation timing by multiplying the corrected voice signal e(t) by the thus-determined gain. Accordingly, the period suppression unit 34 is able to suppress the noise component contained in the first input voice signal even before optimization of the adaptive filter.

In addition, similarly to the first embodiment, the period suppression unit 34 does not suppress the corrected voice signal after a predetermined period of time elapsed from the noise generation timing. This prevents excessive suppression of the corrected voice signal during the lapse of the period of time.

Figure 11:
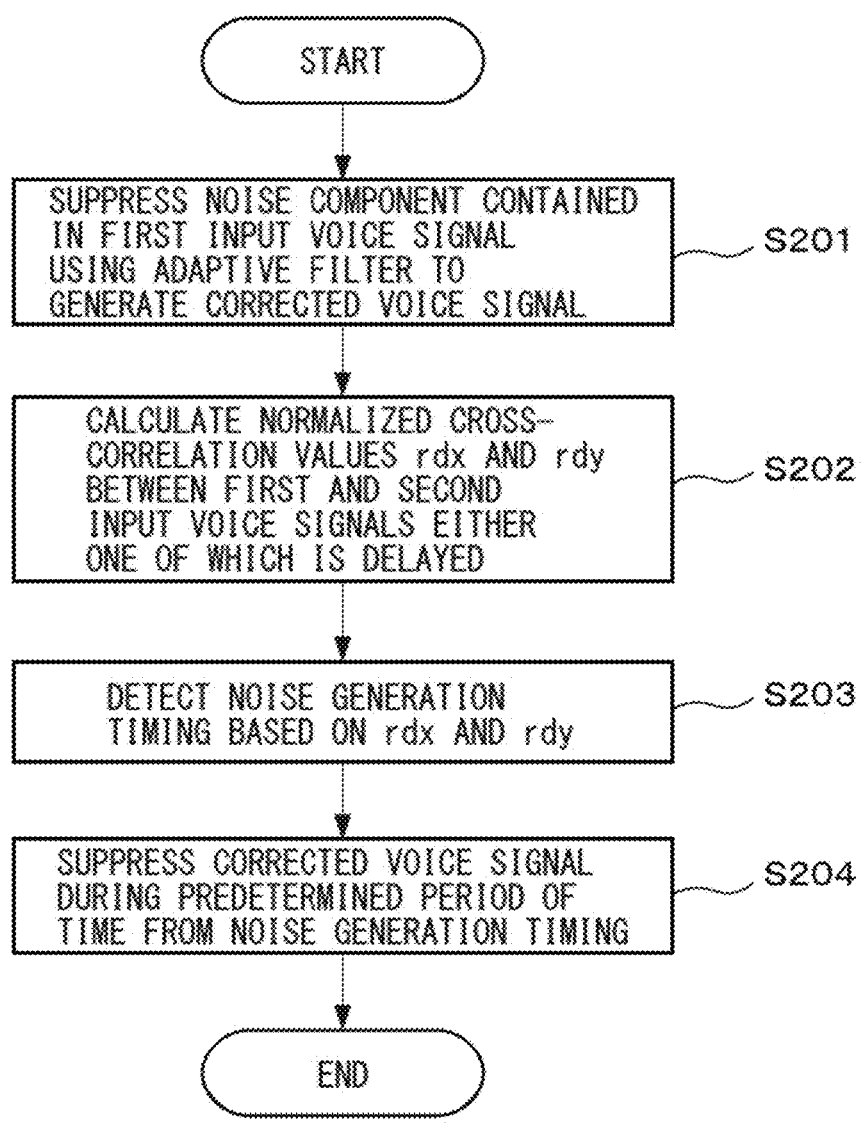
FIG. 11 is an operation flowchart illustrating a noise suppression process according to the second embodiment.

FIG. 11 is an operation flowchart illustrating a noise suppression process executed by the noise suppression device 61. The adaptive filter unit 31 suppresses, by using an adaptive filter, a noise component which is contained in a first input voice signal input from the microphone 4-1 and is originating from a noise source, and generates a corrected voice signal (Step S201).

The correlation value calculation unit 32 calculates a normalized cross-correlation value rdy between the first input voice signal and a second input voice signal input from the microphone 4-2, representing the certainty of being the voice originating from a voice source of interest. Further, the correlation value calculation unit 32 calculates a normalized cross-correlation value rdx between the first input voice signal and the second input voice signal, representing the certainty of being the voice originating from the noise source (Step S202). Then, the noise generation detection unit 33 detects noise generation timing based on the normalized cross-correlation values rdx and rdy (Step S203). For example, the noise generation detection unit 33 detects, as the noise generation timing, a time at which the normalized cross-correlation value rdx exceeds a threshold value ThC1 and the normalized cross-correlation value rdy is equal to or less than a threshold value ThC2 after the normalized cross-correlation value rdx continuously is equal to or less than the threshold value ThC1.

The period suppression unit 34 suppresses the corrected voice signal for a predetermined period of time after the noise generation timing (Step S204). The period suppression unit 34 then outputs the suppressed corrected voice signal. The processing of Step S201 and the processing of Steps S202 and S203 may be parallelly carried out.

Figure 12A:
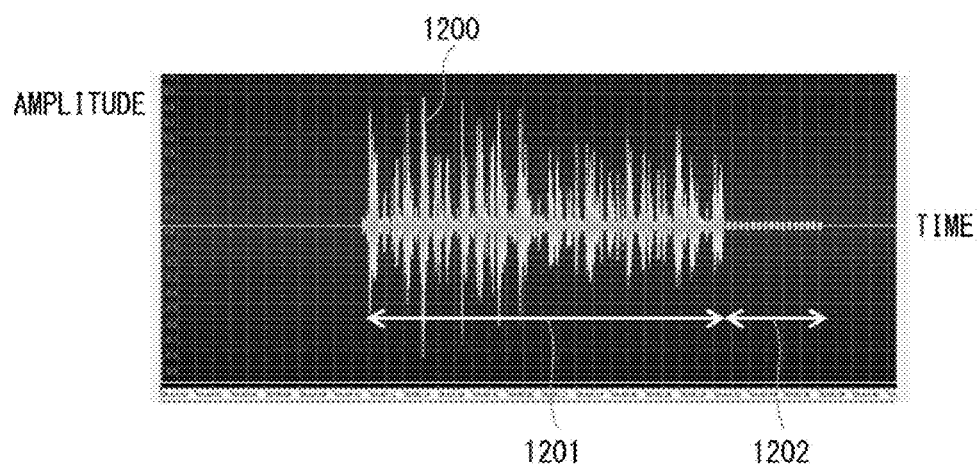
FIG. 12A is a diagram illustrating one example of the time variation in the amplitude of a first input voice signal.
Figure 12B:
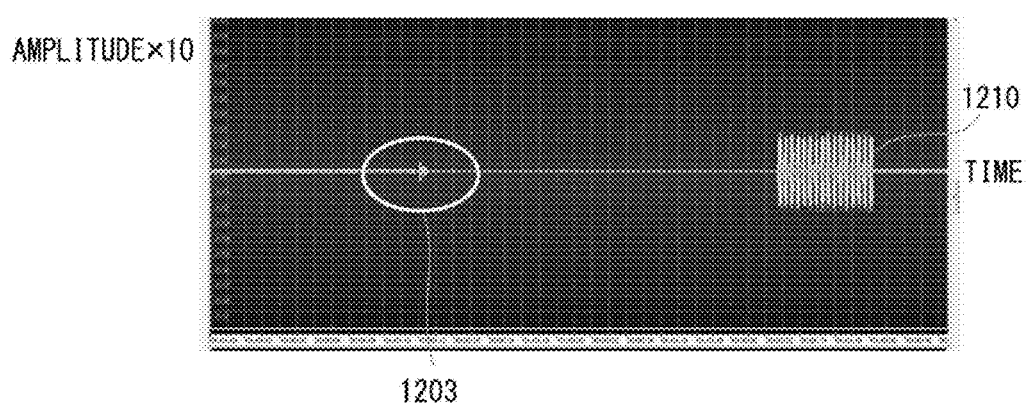
FIG. 12B is a diagram illustrating one example of the time variation in the amplitude of a corrected voice signal when only an adaptive filter process is carried out on the first input voice signal illustrated in FIG. 12A.
Figure 12C:
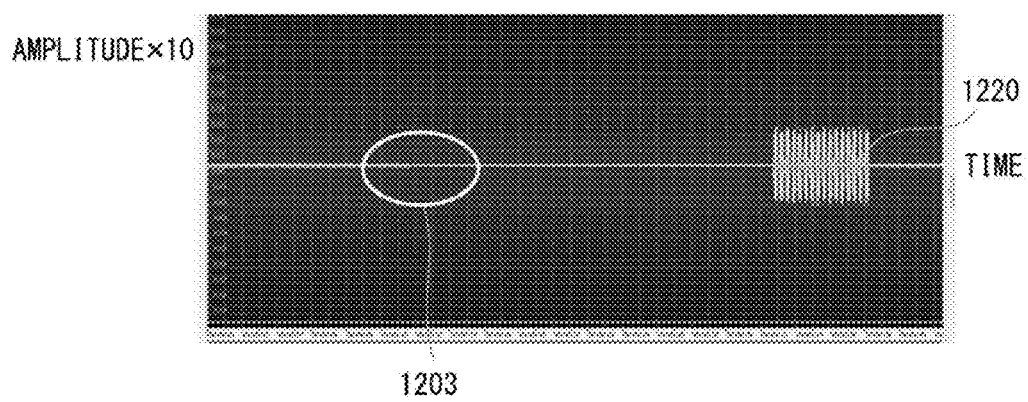
FIG. 12C is a diagram illustrating one example of the time variation in the amplitude of a corrected voice signal obtained by executing the noise suppression process according to the second embodiment on the first input voice signal illustrated in FIG. 12A.

FIG. 12A is a diagram illustrating one example of the time variation in the amplitude of the first input voice signal. FIG. 12B is a diagram illustrating one example of the time variation in the amplitude of the corrected voice signal when only an adaptive filter process is carried out on the first input voice signal illustrated in FIG. 12A. FIG. 12C is a diagram illustrating one example of the time variation in the amplitude of the corrected voice signal obtained by executing the adaptive filter process and the noise suppression process according to the present embodiment on the first input voice signal illustrated in FIG. 12A.

In each of FIGS. 12A to 12C, the abscissa represents a lapse time, and the ordinate represents the amplitude. However, in FIGS. 12B and 12C, the scale of the ordinate is enlarged by ten times relative to the scale of the ordinate in FIG. 12A. As illustrated in FIG. 12A, the first input voice signal 1200 contains a noise component in a noise period 1201. In other words, the passenger utters voice. On the other hand, the first input voice signal 1200 contains a signal component, i.e., the voice uttered by the driver in a voice period 1202 after the noise period 1201. In contrast, as illustrated in FIG. 12B, when only the adaptive filter process is applied to the first input voice signal 1200, the corrected voice signal 1210 contains a residual noise component in a period 1203 immediately after the start of the noise period 1201. On the other hand, as illustrated in FIG. 12C, when the noise suppression process according to the present embodiment is applied to the first input voice signal 1200, it can be understood that the noise component is removed from the corrected voice signal 1220 in the period 1203 immediately after the start of the noise period 1201 as well.

According to the second embodiment, the noise suppression device is able to accurately detect the noise generation timing by using the correlation value between the input voice signals respectively generated at the microphones, and suppresses the voice signal separately from the adaptive filter for a predetermined period of time after the generation timing. Thus, the noise suppression device is able to suppress a noise component immediately after the noise generation and even before optimization of the adaptive filter, and is able to prevent excessive suppression of the voice signal after optimization of the adaptive filter.

The noise suppression device according to each of the above embodiments or their modified examples can be equipped on various devices capable of being connected with a microphone, such as various types of audio equipment or a personal computer.

A computer program for causing a computer to implement the function of each unit of the noise suppression device according to any of the above embodiments or their modified examples may be provided in the form recorded on a computer-readable medium such as a magnetic recording medium or an optical recording medium.

Figure 13:
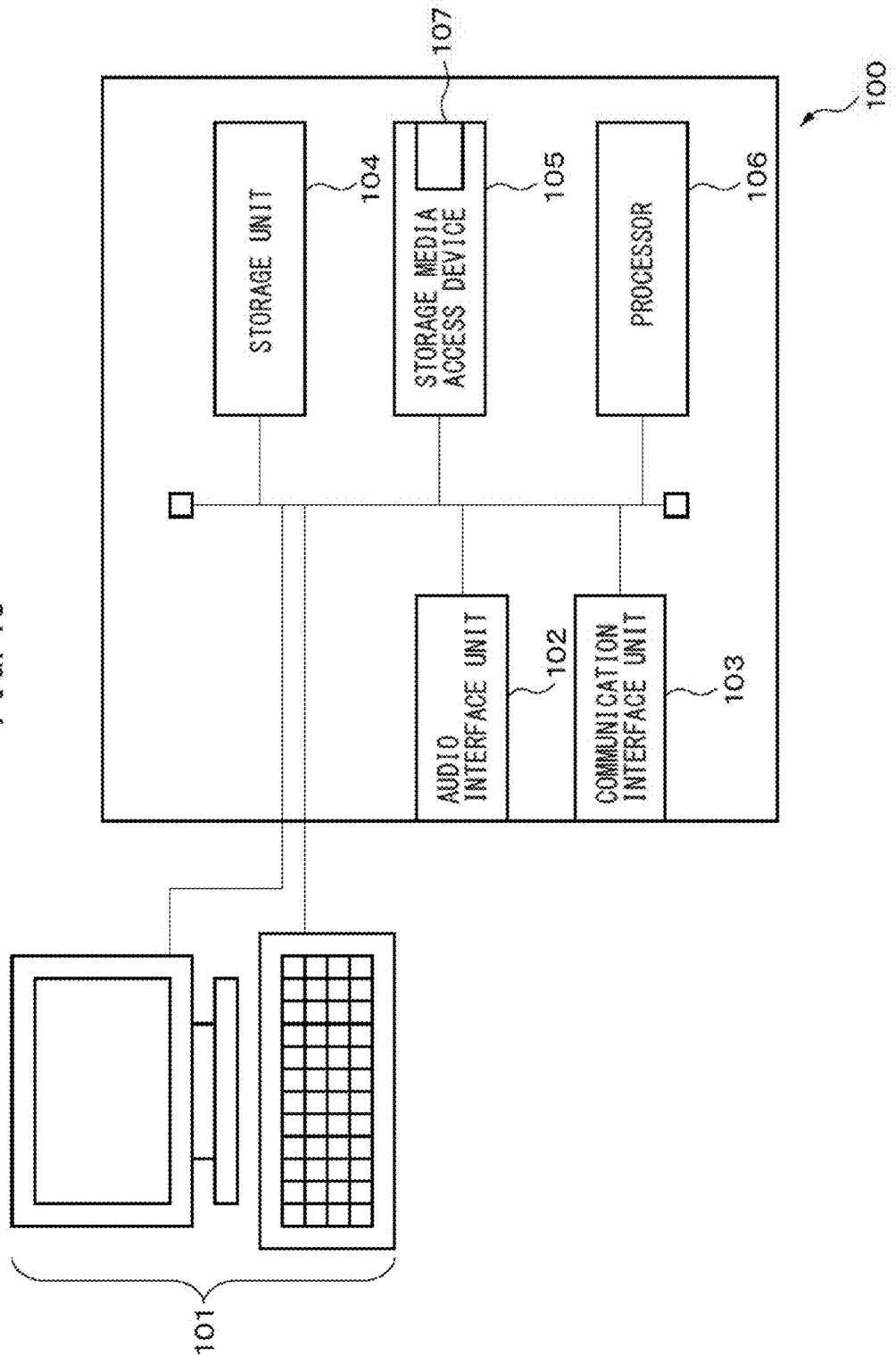
FIG. 13 is a diagram illustrating the configuration of a computer that operates as the noise suppression device by executing a computer program for implementing the functions of each unit of the noise suppression device according to each embodiment or their modified examples.

FIG. 13 is a diagram illustrating the configuration of a computer that operates as the noise suppression device by executing a computer program for implementing the functions of the various units constituting the noise suppression device according to any of the above embodiments or their modified examples.

The computer 100 includes a user interface unit 101, an audio interface unit 102, a communication interface unit 103, a storage unit 104, a storage media access device 105, and a processor 106. The processor 106 is connected to the user interface unit 101, the audio interface unit 102, the communication interface unit 103, the storage unit 104, and the storage media access device 105, for example, via a bus.

The user interface unit 101 includes, for example, an input device such as a keyboard and a mouse, and a display device such as a liquid crystal display. Alternatively, the user interface unit 101 may include a device, such as a touch panel display, into which an input device and a display device are integrated. The user interface unit 101 supplies an operation signal to the processor 106 to initiate a noise suppression process, for example, in accordance with a user operation.

The audio interface unit 102 includes an interface circuit for connecting the computer 100 to a microphone and a loudspeaker (not illustrated). The audio interface unit 102 supplies a reproduced voice signal received from the processor 106 to the loudspeaker. Alternatively, the audio interface unit 102 passes input voice signals respectively received from one or more microphones to the processor 106.

The communication interface unit 103 includes a communication interface used for the connection to a communication network conforming to a communication standard such as the Ethernet (registered trademark), and a control circuit for the communication interface. The communication interface unit 103 acquires a packet containing a reproduced voice signal from another apparatus connected to the communication network, and passes the packet to the processor 106. Further, the communication interface unit 103 may output a packet which contains a noise-suppressed voice signal and is received from the processor 106 to another apparatus via the communication network.

The storage unit 104 includes, for example, a readable/writable semiconductor memory and a read-only semiconductor memory. The storage unit 104 stores a computer program to be executed on the processor 106 for implementing the noise suppression process, and various pieces of data used in the noise suppression process.

The storage media access device 105 is a device that accesses a storage medium 107 such as a magnetic disk, a semiconductor memory card, and an optical storage medium. The storage media access device 105 accesses the storage medium 107 to read, for example, the computer program for noise suppression to be executed on the processor 106, and passes the read computer program to the processor 106.

The processor 106 executes the computer program for noise suppression according to any of the above embodiments or their modified examples, thereby suppressing the noise component contained in the input voice signal received from the microphone. The processor 106 then supplies the corrected voice signal in which the noise component is suppressed to the communication interface unit 103.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A noise suppression device, comprising:
a processor configured to suppress, using an adaptive filter, a noise component contained in a voice signal generated from a voice captured by a microphone to generate a corrected voice signal;
detect, as timing of generation of the noise component in the voice signal, first timing at which a power or an absolute value of an amplitude of a reference signal exceeds a predetermined threshold value after a period of time during which the power or the absolute value of the amplitude of the reference signal continuously is equal to or less than the predetermined threshold value reaches a predetermined time length, the reference signal including a waveform identical to a waveform of a reproduced voice signal which is output from a loudspeaker and is captured by the microphone; and
suppress the corrected voice signal during a predetermined period of time after the timing of generation of the noise component.

2. The noise suppression device according to claim 1, wherein
the processor is further configured to determine, as the predetermined period of time, a period of time from the timing of the generation of the noise component to timing at which learning of the adaptive filter is converged.

3. The noise suppression device according to claim 1, wherein
the processor is further configured to adjust, in accordance with a power of the corrected voice signal, an amount of suppression of the corrected voice signal in the predetermined period of time.

4. The noise suppression device according to claim 1, wherein
the processor is further configured to reduce an amount of suppression of the corrected voice signal in the predetermined period of time as a lapse time from the timing of the generation of the noise component is longer.

5. A noise suppression device, comprising:
a processor configured to suppress, using an adaptive filter, a noise component contained in a voice signal generated from a voice captured by a microphone to generate a corrected voice signal;
detect timing of generation of the noise component in the voice signal; and
suppress the corrected voice signal during a predetermined period of time after the timing of generation of the noise component, wherein
detection of the timing of the generation of the noise component includes detecting the timing of the generation of the noise component based on time variation in a first correlation value between a signal obtained by delaying either one of the voice signal and a second voice signal generated by a second microphone capturing a voice, the second microphone being disposed on a location different from a location of the microphone, in accordance with difference between a first distance from a noise source of the noise component to the microphone and a second distance from the noise source to the second microphone, and the other of the voice signal and the second voice signal.

6. The noise suppression device according to claim 5, wherein
detection of the timing of the generation of the noise component includes detecting, as the timing of the generation of the noise component, first timing at which the first correlation value exceeds a first threshold value and a second correlation value between a signal obtained by delaying either one of the voice signal and the second voice signal in accordance with a difference between a third distance from a voice source of a voice intended to be detected to the microphone and a fourth distance from the voice source to the second microphone, and the other one of the voice signal and the second voice signal is equal to or less than a second threshold value, after a period of time during which the first correlation value continuously is equal to or less than the first threshold value reaches a predetermined time length.

7. The noise suppression device according to claim 6, wherein
the processor is further configured to determine, as the predetermined period of time, a period of time from the timing of the generation of the noise component to timing at which the second correlation value exceeds the second threshold value.

8. The noise suppression device according to claim 5, wherein the processor is further configured to determine, as the predetermined period of time, a period of time during which a power of the corrected voice signal exceeds a power threshold value.

9. A noise suppression method, comprising:
suppressing, using an adaptive filter, a noise component contained in a voice signal generated from a voice captured by a microphone to generate a corrected voice signal;
detecting, as timing of generation of the noise component in the voice signal, first timing at which a power or an absolute value of an amplitude of a reference signal exceeds a predetermined threshold value after a period of time during which the power or the absolute value of the amplitude of the reference signal continuously is equal to or less than the predetermined threshold value reaches a predetermined time length, the reference signal including a waveform identical to a waveform of a reproduced voice signal which is output from a loudspeaker and is captured by the microphone; and
suppressing the corrected voice signal during a predetermined period of time after the timing of the generation of the noise component.

10. The noise suppression method according to claim 9, further comprising:
determining, as the predetermined period of time, a period of time from the timing of the generation of the noise component to timing at which learning of the adaptive filter is converged.

11. The noise suppression method according to claim 9, further comprising:
adjusting, in accordance with a power of the corrected voice signal, an amount of suppression of the corrected voice signal in the predetermined period of time.

12. The noise suppression method according to claim 9, further comprising:
reducing an amount of suppression of the corrected voice signal in the predetermined period of time as a lapse time from the timing of the generation of the noise component is longer.

13. A noise suppression method, comprising:
suppressing, using an adaptive filter, a noise component contained in a voice signal generated from a voice captured by a microphone to generate a corrected voice signal;
detecting timing of generation of the noise component in the voice signal; and
suppressing the corrected voice signal during a predetermined period of time after the timing of the generation of the noise component, wherein
detection of the timing of the generation of the noise component includes detecting the timing of the generation of the noise component based on time variation in a first correlation value between a signal obtained by delaying either one of the voice signal and a second voice signal generated by a second microphone capturing a voice, the second microphone being disposed on a location different from a location of the microphone, in accordance with difference between a first distance from a noise source of the noise component to the microphone and a second distance from the noise source to the second microphone, and the other of the voice signal and the second voice signal.

14. The noise suppression method according to claim 13, wherein
detection of the timing of the generation of the noise component includes detecting, as the timing of the generation of the noise component, first timing at which the first correlation value exceeds a first threshold value and a second correlation value between a signal obtained by delaying either one of the voice signal and the second voice signal in accordance with a difference between a third distance from a voice source of a voice intended to be detected to the microphone and a fourth distance from the voice source to the second microphone, and the other one of the voice signal and the second voice signal is equal to or less than a second threshold value, after a period of time during which the first correlation value continuously is equal to or less than the first threshold value reaches a predetermined time length.

15. The noise suppression method according to claim 14, further comprising:
determining, as the predetermined period of time, a period of time from the timing of the generation of the noise component to timing at which the second correlation value exceeds the second threshold value.

16. The noise suppression method according to claim 13, further comprising:

determining, as the predetermined period of time, a period of time during which a power of the corrected voice signal exceeds a power threshold value.

17. A non-transitory computer-readable recording medium having recorded thereon a noise suppression computer program that causes a computer to execute a process comprising:

suppressing, using an adaptive filter, a noise component contained in a voice signal generated from a voice captured by a microphone to generate a corrected voice signal;

detecting, as timing of generation of the noise component in the voice signal, first timing at which a power or an absolute value of an amplitude of a reference signal exceeds a predetermined threshold value after a period of time during which the power or the absolute value of the amplitude of the reference signal continuously is equal to or less than the predetermined threshold value reaches a predetermined time length, the reference signal including a waveform identical to a waveform of a reproduced voice signal which is output from a loudspeaker and is captured by the microphone; and suppressing the corrected voice signal during a predetermined period of time after the timing of the generation of the noise component.

18. A non-transitory computer-readable recording medium having recorded thereon a noise suppression computer program that causes a computer to execute a process comprising:

suppressing, using an adaptive filter, a noise component contained in a voice signal generated from a voice captured by a microphone to generate a corrected voice signal;

detecting timing of generation of the noise component in the voice signal; and suppressing the corrected voice signal during a predetermined period of time after the timing of the generation of the noise component, wherein detection of the timing of the generation of the noise component includes detecting the timing of the generation of the noise component based on time variation in a first correlation value between a signal obtained by delaying either one of the voice signal and a second voice signal generated by a second microphone capturing a voice, the second microphone being disposed on a location different from a location of the microphone, in accordance with difference between a first distance from a noise source of the noise component to the microphone and a second distance from the noise source to the second microphone, and the other of the voice signal and the second voice signal.

* * * * *